United States Patent [19]

Okaniwa et al.

[11] Patent Number: 4,724,010
[45] Date of Patent: Feb. 9, 1988

[54] SOLAR CELL MODULE

[75] Inventors: Hiroshi Okaniwa, Hachioji; Kenji Nakatani; Kazutomi Suzuki, both of Hino, all of Japan

[73] Assignee: Teijin Limited, Osaka, Japan

[21] Appl. No.: 932,076

[22] Filed: Nov. 19, 1986

[30] Foreign Application Priority Data

Jun. 19, 1986 [JP] Japan .................. 61-141421

[51] Int. Cl.⁴ .......................................... H01L 25/02
[52] U.S. Cl. ............................ 136/246; 136/244; 136/248; 136/251
[58] Field of Search .............. 136/248, 251, 246, 244

[56] References Cited

U.S. PATENT DOCUMENTS

| 4,135,537 | 1/1979 | Blieden et al. | 136/247 |
| 4,137,097 | 1/1979 | Kelly | 136/248 |
| 4,186,033 | 1/1980 | Boling et al. | 136/247 |
| 4,587,376 | 5/1986 | Kosaka et al. | 136/248 |

FOREIGN PATENT DOCUMENTS 58-68989  4/1983  Japan .................. 136/248

OTHER PUBLICATIONS

K. Kurokawa et al., Int'l. PVSEC-1, pp. 665–668.

Primary Examiner—Aaron Weisstuch
Attorney, Agent, or Firm—Sughrue, Mion, Zinn, Macpeak and Seas

[57] ABSTRACT

A solar cell module is made lightweight without a substantial loss of the performance of the module by using a transparent hollow multilayer structure in which a plurality of transparent sheets are spaced at a distance by reinforcing members inserted between and connected to the transparent sheets as a window member as well as a supporting member of the module by disposing said transparent hollow multilayer structure on the light receiving side of a solar power generation element.

19 Claims, 9 Drawing Figures

SOLAR CELL MODULE

BACKGROUND OF THE INVENTION

1. Field of the Invention

The present invention relates to a solar cell module suitable for power generation, more specifically, to a solar cell module which has light weight but is still sufficiently mechanically strong for practical use.

2. Description of the Related Art

Solar cell modules (hereinafter also simply referred to as a "module"), are known in which structural members of tempered glass used as a transparent window and a metal sheet or the like used as a sealing member, are adhered to each other by polyvinyl butyral or ethylene vinyl acetate resin as a pottant and are sealed with a metal or plastic frame (for example, Takahashi and Konagai "Amorphous Solar Cells", published by Shokodo, pp 17–18).

Modules having the structure mentioned-above are necessarily heavy, and therefore, the foundation and mounting thereof must be mechanically very strong in order to support such heavy modules when installed as an array. Solar power generation costs include not only the cost of the module but also the cost for such additional structural members or portions. To bring the costs of solar power generation to a practical level, the cost of the additional structural members or portions and the cost of a module must be reduced.

In consideration of the above, it has been proposed to use, between the solar power generation element and the sealing member, an aluminum honeycomb structure, a paper honeycomb or a rib structure as a supporting member for supporting the sealing member and for withstanding wind pressure. The use of such a supporting member reduces both the weight of the module and the load on the foundation and the mounting of an array. Thus, a reduction of cost for the structural members or portions is attained. (see, K. Kurokawa et al "Development of Large-Size and Light-Weight PV Modules Reinforced by Paper Honeycomb Structure", *Technical Digest of the International PV SEC-1, Kobe, Japan*, pp (665–668)

Nevertheless, a tempered glass sheet having a thickness of not less than 3.2 mm must be used as the transparent window member to ensure sufficient strength against hailstorms and wind pressure. Particularly, if an amorphous solar cell made on a glass substrate is used, the glass substrate and the window on the side from which sunlight is incident constitute double glass sheets. This construction necessarily places a limit on the lightening of the module. Moreover, the honeycomb or rib structure mentioned above functions as a thermal insulation layer and causes an increase of the surface temperature of the solar cells, thereby reducing the photoelectric conversion efficiency.

SUMMARY OF THE INVENTION

The object of the present invention is to solve the above-mentioned problems of the prior art and to provide a solar cell module which is lightweight and has a simple structure, to enable a reduction of the cost of solar power generation and an expansion of the various usages thereof.

The above and other objects, features and advantages of the present invention are attained by a solar cell module comprising a solar power generation element supported by a window member and sealed as a whole, in which the window member is a transparent hollow multilayer structure comprising a plurality of transparent sheets spaced with reinforcing members inserted therebetween and connected to the transparent sheets, and wherein the transparent hollow multilayer structure of the window member is disposed on the light receiving side of the solar power generation element.

In the present invention, a window member of a transparent hollow multilayer structure, which is lightweight but has sufficient mechanical strength, serves as a supporting member, thus enabling a solar cell module that is light weight and simple in structure.

The transparent hollow multilayer structure used as a window member in the present invention is a transparent light-weight sheet-like structure in which a plurality of transparent sheets are spaced at a certain distance and bonded with reinforcing members. For example, spaced synthetic resin sheets of high shock resistance and good workability are bonded or bridged with reinforcing members such as a honeycomb structure, spatially arranged ribs, or a corrugated sheet so that sufficient mechanical strength and light weight are attained in the structure. The synthetic resin sheet is not limited, as long as it is transparent, and may be any known transparent sheet of polycarbonate resin, acrylic resin, etc. Polycarbonate resin sheet is preferable because of its superior shock resistance. The reinforcing members of the transparent hollow multilayer structure are not limited, as long as they are lightweight and have sufficient mechanical strength, but are preferably members causing only a low loss in the light transparency of the hollow multilayer structure. Thus, a plate-like member, a pillar-like member, or a framed structure of these members, etc. may be used as the reinforcing members. Preferably, a cell structure in which plate-like members are arranged to form many cells (hollow sections) in a multilayer structure is used, because of its superior strength and light transparency. As such a cell structure, there may be used a multirib structure in which spaced transparent sheets are bonded with ribs arranged at a certain distance to form pillar-shaped hollow sections parallel to each other and to the sheets; or a honeycomb structure in which plate-like members are arranged between spaced transparent sheets to form hollow sections vertical to the sheets in the form of sections such as circles, a honeycomb, rectangles, squares, etc. Such a honeycomb structure is available in various honeycomb and roll care structures, both produced and sold as core members by Shinnippon Core K.K.

The transparent hollow multilayer structure can be produced, for example, in the following ways. Referring to FIG. 1, a transparent hollow multilayer structure 1 comprises a honeycomb matrix as a reinforcing member 2. The reinforcing member 2 is a paper honeycomb matrix known as Honeycomb P (produced by Shinnippon Core K.K.) with a layer thickness or height of about 10 mm, and the transparent sheets 3 and 4 are made of polycarbonate resin, etc., which are adhered with polyvinyl butyral resin. A hollow multilayer structure of a multirib construction can be produced by extruding polycarbonate resin etc., through a die having the same rib structure as that of the side section of the multilayer structure. In the present invention, a transparent hollow multilayer structure of a hollow multirib construction made by extrusion of a transparent synthetic resin is preferably used as a window member, because of the superior sunlight transparency and productivity of the transparent hollow multilayer structure. As a transparent hollow multilayer structure of such a multirib construction, Panlight Uni, produced and sold by Teijin Kasei K.K. as a transparent thermal insulating material, can be used.

Synthetic resin sheets as mentioned above have a water vapor permeability and allow the transmission of moisture therethrough. As a result, moisture condensation occurs in the hollow portions of the transparent hollow multilayer structure and the transparent window may be is clouded, and thus the light transparency thereof reduced. Moreover, if moisture reaches the surface of the solar power generation element, corrosion is accelerated at the surface of the electrodes. This is not preferable from the viewpoint of the long term stability of the solar cell module. Further, a hollow multilayer structure as considered functions as a thermal insulating layer and causes an increase of the temperature of the surface of the solar power generation element, thereby necessarily reducing the electric conversion efficiency.

To remove the above-mentioned deficiencies and to utilize the advantages of a hollow multilayer structure, all hollow portions or sections in the transparent hollow multilayer structure are communicated with the ambient air and the hollow multilayer structure frame is formed so that this communication is maintained, whereby the thermal insulating property of the hollow multilayer structure is reduced. The above-mentioned multirib structure having parallel pillar-like hollow sections is preferable because it is easily ventilated. In this regard, it is preferable to install a solar cell module in such a manner that the parallel pillar-like hollow sections of multilayer structure as above are inclined to the horizontal plane or to the ground. This type of installation allows ascending air to flow through the pillar-like hollow sections as a part of normal convection and allows the prevention of an increase in the temperature of the surface of the hollow multilayer structure as well as the removal of moisture condensed in the pillar-like hollow sections.

Further, a water vapor proofing film can be provided on the surface, facing the solar power generation element, of the hollow multilayer structure, to prevent water vapor permeation to the surface of the solar power generation element. The water vapor proofing film may be an inorganic film such as an amorphous silicon film or an indium oxide film, or an organic film such as a polyvinylidene fluoride film. Among these, the indium oxide film is preferable because of its transparency and superior adhesion properties to the neighboring layers.

Further, a transparent abrasion resistant film may be optionally provided on the surface, exposed to the ambient air of the hollow multilayer structure, to improve the resistance thereof to abrasion and scratches. Such an abrasion resistant film may be any known film such as an ultraviolet light cured or heat cured type resin film. To improve the light resistance of the synthetic resin sheet or structure, an ultraviolet light absorbing agent may be added to the abrasion resistant film or an ultraviolet light absorbing film may be inserted under the abrasion resistant film.

The solar power generation element in the present invention is not particularly limited and may consist of any known solar cell, for example, a silicon-based solar cell using single crystalline and polycrystalline silicon semiconductor layers as a photovoltaic layer, or a compound semiconductor-based solar cell using II-VI type semiconductor and III-V type semiconductor layers as a photovoltaic layer. Particularly, so-called "integrated solar cells" comprising an electrically insulating monolithic substrate and a plurality of solar cells formed on the insulating layer and electrically connected in series and/or parallel are preferably used. Typical integrated solar cells include amorphous silicon solar cells and II-VI type compound semiconductor solar cells. Thin film type solar cells such as amorphous silicon-based integrated solar cells formed on a flexible insulating substrate are preferable because they are in the form of a film and are light weight. Such integrated solar cells in which an amorphous silicon semiconductor layer is used as a photovoltaic layer can be attained in the following manner.

The insulating substrate may be a polymer film, a ceramic plate, a glass plate, or a metal foil with an insulating film formed on the surface of the metal foil, and is preferably a ribbon-like flexible substrate which allows a continuous process of film depositing and cutting. As a metal electrode layer, to be formed on the substrate, this may be a single or laminated layer made of a metal such as Ti, Ag, W, Pt, Ni, Co, and Cr, or an alloy such as nichrome or stainless steel. The amorphous silicon semiconductor used as the photovoltaic layer may be constructed as a pin structure composed of p, i and n-type semiconductor materials or a multilayered tandem structure such as a pin/pin or pin/pin/pin structure, and may additionally incorporate a narrow or wide bandgap layer such as an amorphous silicon germanium layer or an amorphous silicon carbide layer, if desired. As a transparent electrode layer to be formed on the photovoltaic layer, a known transparent electrically-conductive layer of, e.g., tin oxide, indium tin oxide (ITO), or cadmium stannic oxide may be used. To produce integrated solar cells, the amorphous silicon solar cell formed on a monolithic substrate as above is then divided by laser scribing or cutting with a knife into cell units having an adequate area. The divided cell units are electrically connected to form integrated cells. The method for electrically connecting the cells is not particularly limited, as long as it allows connection between the upper and lower electrodes of neighboring cells, and may be any known method, for example, connection with leads, forming a connecting layer of a metal by physical vapor deposition, etc., forming a connecting layer of electrically conductive resin by screen printing, and the like. Examples of the formation of electrically connecting cell units are described in detail in U.S. patent application Ser. No. 828,197 filed on Feb. 10, 1986, and in the following Examples.

The material for sealing the solar power generation element on the side opposite to the side of the window member, necessary if the substrate of the solar power generation element is water vapor permeable, may be any material that can prevent the penetration of water or moisture, and can be a metal sheet treated to give corrosion resistance, or a so called water vapor proofing film composed of an aluminum foil adhered to a polyester or polyvinylidene film. Among these, a water vapor proofing film of an aluminum foil adhered to a polyester film is preferable for the present invention because of its light weight.

As the pottant which is used to adhere the window member, the solar power generation element, and the sealing material together, to seal the solar power generation element, and further, to serve as a cushion layer, polyvinyl butyral resin, ethylene vinyl acetate resin, etc. are used since they are light resistant and have excellent adhesion with other component members.

The solar cell module according to the present invention is constructed by adhering the transparent hollow multilayer structure, the solar power generation element, and if necessary, the sealing material, in this sequence, followed by sealing the periphery of the above assembly with a frame, if necessary.

As shown in the plan view of FIG. 2, a typical solar power generation element has collector electrodes 11 comprising a bus bar 11A and fingers 11B extending from the bus bar 11A in the form of a comb on the transparent electrode of the solar power generation element to effectively collect generated current. The collector electrodes are formed by screen printing, e.g., a silver-based resin, by evaporating or sputtering silver, aluminum, etc., or by adhering a metal foil. Preferably, the window member is disposed on the solar power generation element in such a manner that the reinforcing members of the window member overlap with the bus bars in order to minimize the loss of light transmission to active or photoelectric conversion regions of the solar power generation element. In integrated solar cells, the bus bars of the collector electrodes preferably are present at portions between respective cells, where the cells are electrically connected in series and/or parallel, and the reinforcing members of the window member overlap such bus bars. This allows maximum reception, through the window member, of sunlight by active regions of photoelectric conversion regions of the solar power generation element.

When an example of a solar cell module according to the present invention is fabricated from a transparent hollow multilayer structure of a multirib structure made of polycarbonate resin and having a thickness of 4 mm, integrated amorphous silicon solar cells using a 0.1 mm thick polyester film as a substrate, and a sealing material composed of polyvinylidene fluoride/aluminum foil/-polyvinylidene fluoride and having a thickness of 0.3 mm, the total thickness of the module is at most 4.5 mm, the total weight is about 1.0 kg/m$^2$, and the module is not damaged when a 500 g-steel ball is dropped on the module from a 5 m height. In contrast, when a solar cell module with the same construction, except that a tempered glass sheet with a thickness of 3.2 mm is used in place of the transparent hollow multilayer structure as the window member, the total thickness of the module is 3.7 mm, which is slightly thinner than the module of the present invention, the total weight is about 9.0 kg/m$^2$, which is much heavier than the module of the present invention, and the module is not damaged only when a 225 g-steel ball is dropped from a 1.5 m height. As is clear from this comparison, the present invention allows the solar cell module to be light in weight without a reduction in mechanical strength and enables the module to have a simple laminate structure.

DESCRIPTION OF THE PREFERRED EMBODIMENTS

The present invention is further described by the following Examples.

Solar power generation element

Figure 1:
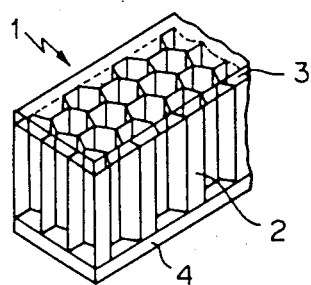
FIG. 1 is a perspective view of a reinforcing member having a honeycomb structure known in the prior art, although this reinforcing member can be used in a module according to the present invention if it is transparent.
Figure 2:
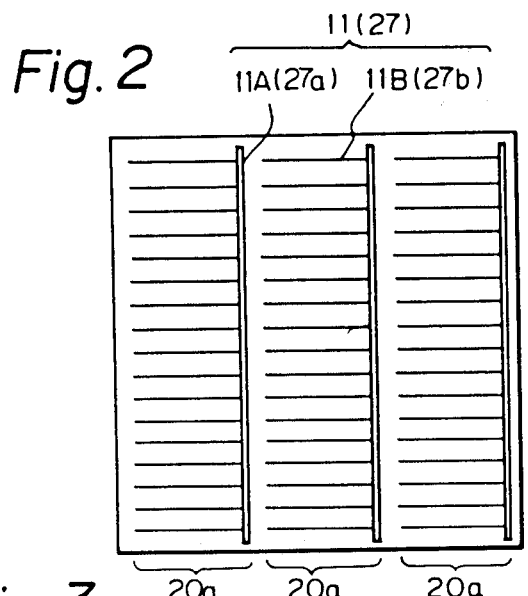
FIG. 2 is a plan view of integrated solar cells.
Figure 3:
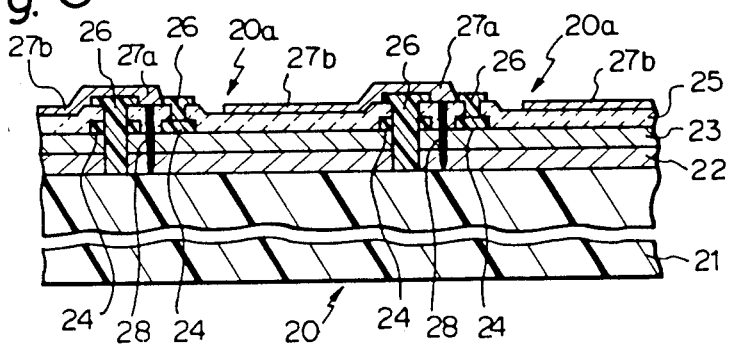
FIG. 3 is a partial sectional view of integrated solar cells.

FIG. 3 shows a sectional side view of an example of a solar power generation element 20. The polymer film used as substrate 21 may be any polymer film sufficiently resistant to heat during the deposition of amorphous silicon, but is preferably a polyethylene terephthalate (PET) film, polyimide film or the like. In the example shown in FIG. 3, the substrate 21 is made of a PET film.

The metal electrode layer 22 is an Al/SS (stainless steel) laminated formed by depositing aluminum to a thickness of about 0.5 μm, and then stainless steel to a thickness of about 3 nm.

The amorphous silicon semiconductor layer used as a photovoltaic layer 23 is of known pin structure and is formed by deposition by the glow discharge decomposition of a silane gas etc., as described in Japanese Unexamined Patent Publication (Kokai) No. 59-34668.

Epoxy resin patterns 24 are screen printed on the amorphous silicon semiconductor layer 23. These epoxy resin patterns 24 serve as an electrically insulating resin layer between the metal electrode 22 and a transparent electrode layer 25 to be formed on the amorphous silicon semiconductor layer 23 at portions where laser scribing is to be conducted. This is because laser scribing may cause short circuits between the electrode layers 22 and 25 if an insulating pattern or layer 24 is not deposited, due to a diffusion of electrode materials into the amorphous silicon semiconductor layer 23 and crystallization of the amorphous silicon semiconductor layer to make portions near the laser scribed removed patterns conductive. Thus, the insulating patterns 24 are formed on portions of the amorphous silicon semiconductor layer 23 where laser scribing is to be conducted.

An indium tin oxide (ITO) layer as a transparent electrode layer 25 is formed by electron beam deposition or sputtering, to a layer thickness of about 60 nm. Thus there is obtained a large area film-like amorphous solar cell having a PET//Al/SS//amorphous silicon pin//patterned epoxy resin layer//ITO structure.

The amorphous solar cell of the above structure having a size of 10 cm×10 cm is divided into three divisional cells of about 3 cm×10 cm in size, by scanning an yttrium aluminum garnet (YAG) laser beam along the epoxy resin patterns 24 to fuse and evaporate or remove required patterns. As required, scribing through the transparent electrode layer 25 and the metal layer 22 or only through the transparent electrode layer 25 is performed. The grooves formed by laser scribing are filled with insulating resin 26 by screen printing, etc. On the divided cells 20a, collector electrodes 27 comprising a bus bar portion 27a and finger portions 27b in the form of a comb, as known, are then formed by screen printing an electrically conductive ink. Then, a laser beam is scanned on the bus bar portions 27a to weld the collector electrode 27 or the transparent electrode layer 25 of one cell 20a and the metal electrode layer 22 of the neighboring cell 20a to form an electrical connection 28 therebetween. Thus, an integrated amorphous silicon solar cells in which three cells 20a are electrically series-connected is obtained.

Transparent hollow multilayer structure

Figure 4A:
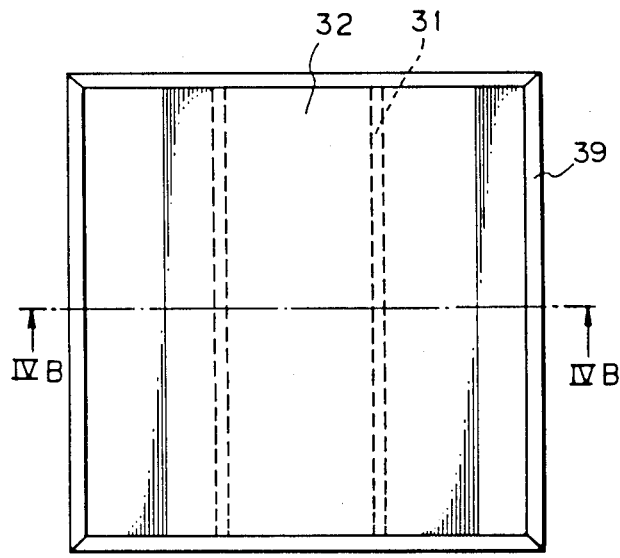
FIGS. 4A and 4B are plan and sectional side views of a solar battery module, FIG. 4B being a section taken along the line IVB—IVB in FIG. 4A.
Figure 4B:
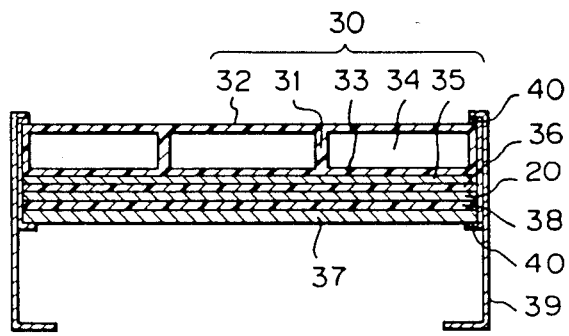

Refer to FIGS. 4A and 4B.

As a transparent hollow multilayer structure 30, Panlight Uni obtained from Teijin Kasei K.K. is used and cut to a size of 100 mm×100 mm by a chip saw. Panlight Uni is produced by extruding polycarbonate resin and a multirib structure comprising two sheets 32 and 33 1 mm in thickness, spaced and bonded with reinforcing members or ribs 31 1 mm in thickness and 7 mm in height, to forming parallel pillar-like hollow sections 34 of 30 mm×7 mm sectional size therein. The total thickness of the multirib structure is 9 mm and the weight is about 2 kg/m². A water vapor proofing film 35 of indium tin oxide having a thickness of about 30 nm is formed on one outer surface of the multirib structure.

Further, similar transparent hollow multilayer structures may be made using a multirib structure commercially available from Teijin Kasei K.K., but the distance between neighboring parallel ribs is 15 mm, not 30 mm, and the parallel pillar-like cells have a size of 15 mm×7 mm, not 30 mm×7 mm.

Fabrication of modules

In adhering the hollow multilayer structure 30 and the solar power generation element 20 of integrated amorphous silicon solar cells, an ethylene vinyl acetate film 0.4 mm in thickness is used as a pottant 36 and inserted therebetween. On the other side of the solar power generation element 20, a sealing material 37 is laminated with another pottant 38 inserted between the sealing material 37 and the solar power generation element 20. This pottant 38 is also an ethylene vinyl acetate resin film 0.4 mm in thickness. The sealing material 37 is a water vapor proofing film having a three-layered structure composed of 0.015 mm thick aluminum foil, a 0.03 mm thick ethylene vinyl acetate resin layer, and a 0.075 mm thick polyester film. The above lamination is passed between hot rolls (one roll is at 90° C. and the other at 180° C., and the hollow multilayer structure 30 faces the hot roll at 90° C.) and hot pressed to obtain a solar cell module body according to the present invention.

Figure 5:
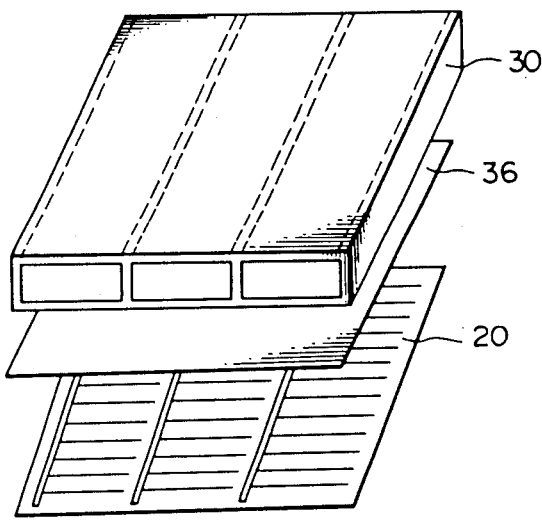
FIGS. 5 to 7 are perspective views of a solar cell module before assembly.

Then the module body is fitted with an aluminum frame 39, using butyl rubber as a sealing agent 40. Thus, the solar battery modules shown in the Figures are obtained. One of the resultant modules is schematically shown in plan view in FIG. 4A and in a sectional side view in FIG. 4B. In fabricating this module, as seen in FIG. 5, the solar power generation element 20 is adhered to the window member or the transparent hollow multilayer structure 30 having the pillar-like hollow sections 30 mm×7 mm in sectional size in such a manner that the bus bars 27b of the solar power generation element 20 overlap the reinforcing members or ribs 31 of the transparent hollow multilayer structure 30, respectively. The frame 39 is attached to the solar cell module body in such a manner that all pillar-like hollow sections 34 are open to the atmosphere at both ends of the cells 34. This module is referred as to Example 1.

Figure 6:
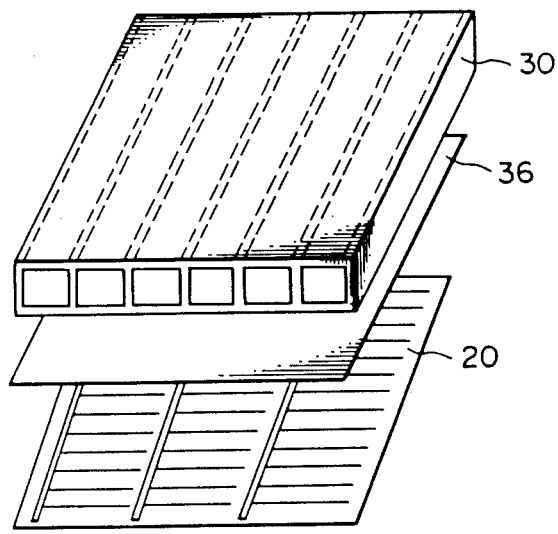
Figure 7:
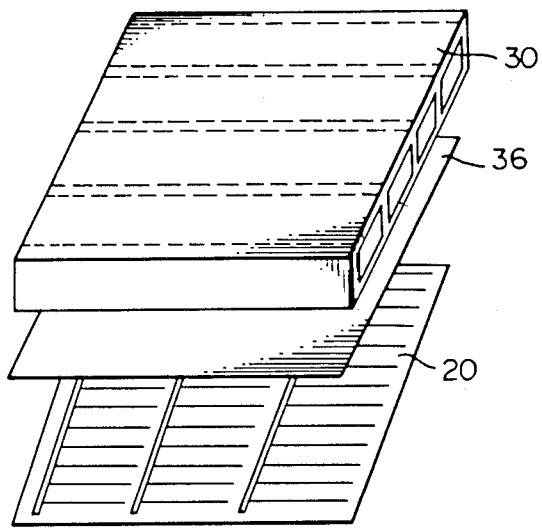

Two other exemplary modules include a transparent hollow multilayer structure 30 having pillar-like hollow sections 15 mm×7 mm in sectional size. These hollow multilayer structures 30 are adhered to the solar power generation element 20, as shown in FIGS. 6 and 7, respectively. These two modules are referred as to Examples 2 and 3, respectively. In the module of Example 2, the solar cell module body is framed with a frame 39 in the same manner as in Example 1. In the module of Example 3, the solar cell module body is framed with a frame 39 in such a manner that both ends of the pillar-like hollow sections 34 are closed by the frame 39.

For comparison, a solar cell module with the same constitution as that of the solar cell module of Example 3 was fabricated, but tempered glass of 3.2 mm in thickness was used in place of the transparent hollow multilayer structure or the window member 30.

The performance of each of the resultant four modules of series-connected solar cells was examined under a solar simulator having a power density of 100 mW/cm² and an air mass (AM) of 1. Further, the four solar cell modules were installed in such a manner that the pillar-like hollow sections 34 were inclined at an angle of 35 degrees from the horizontal plane or the ground and the inclined solar cell modules were allowed to stand under the sunlight. The temperatures of the modules were measured by inserting a thermocouple between the pottant 36 and the solar power generation element 20. The air temperature during this measurement was 20° C.

The results are tabulated in the following Table 1.

TABLE 1

| | Performance | | | | |
| --- | --- | --- | --- | --- | --- |
| Module | Efficiency (%) | Open-circuit Voltage (V) | Short-circuit Current (mA/cm²) | Fill Factor (%) | Temperature of Module (°C.) |
| Example 1 | 5.08 | 2.66 | 3.54 | 54 | 30 |
| Example 2 | 4.84 | 2.65 | 3.38 | 54 | 32 |
| Example 3 | 4.56 | 2.52 | 3.35 | 54 | 50 |
| Comparison Example | 5.03 | 2.58 | 3.61 | 54 | 42 |

As seen in Table 1, the photoelectric conversion efficiencies of the modules according to the present invention are reduced by about 4% in Example 2 and about 9% in Example 3 in comparison to the Comparison Example, because of the absorption of sunlight by the ribs (31 in FIG. 4B). There is little loss of performance of the solar cell modules according to the present invention. Moreover, the efficiency in Example 1 is improved. In the module of Example 1, the reinforcing members or ribs 31 overlapped the bus bar portions or the series-connected portions, so that substantial loss of the active area or photoelectric conversion area is minimized or completely avoided. The improvement of the efficiency of the module of Example 1 results from the lowering of the temperature of the installed module as described below.

From Table 1, it is seen that the temperature of the module was increased in Example 3 but reduced in Examples 1 and 2, in comparison with that of the Comparison Example. The above temperature increase in Example 3 occurred because the sealed hollow multilayer structure functioned as a thermal insulating layer. This problem could be solved by opening the hollow sections in the hollow multilayer structure to the ambient air. In the constitution and installation of Examples 1 and 2, the pillar-like hollow sections of the transparent hollow multilayer structure according to the present invention act as chimneys to cool the module by air convection. Generally, the lower the temperature of the module, the higher the open-circuit voltage. Thus, the cooling action of the modules of Examples 1 and 2 resulted in an increase of the open-circuit voltage in comparison with that of the Comparison Example. From the combined effect of this increase in the open-circuit voltage and the substantial elimination of loss of the active area in the module of Example 1, the efficiency of the module of Example 1 was improved in comparison with that of the Comparison Example.

It was further confirmed that the water vapor proofing property of the transparent hollow multilayer structure according to the present invention was at a similar level to that of the tempered glass sheet module of the Comparison Example, if the hollow multilayer structure was provided with a water vapor proofing film.

Next, the mechanical strength of the modules was tested by dropping a steel ball onto the module, to see whether the present invention could give the module a lighter weight without losing mechanical strength. The results are tabulated in Table 2.

TABLE 2

| Module | Mechanical strength | Weight (kg/m$^2$) |
| --- | --- | --- |
| Example 1 and 2 | Not damaged by 5 m - drop of 500 g - steel ball | about 2 |
| Example 3 | Not damaged by 5 m - drop of 500 g - steel ball | about 2 |
| Comparison Example | Damaged by 5 m - drop of 500 g - steel ball | about 9 |

From Table 2, it is clear that the shock resistance of the modules according to the present invention was greatly improved.

From the above description, it is clear that the solar cell module according to the present invention was made lighter in weight with only slight loss or even an improvement in the performance. This lightweight module allows a reduction of the load on the foundation and the module array when an array is installed using the module. Thus, the module according to the present invention allows a reduction in the cost of not only the module itself but also the structural members or portions. Moreover, in the solar cell module according to the present invention, effective practical results are obtained; such as an improvement of the shock resistance of the module and a reduction of the temperature of the module under sunlight. Further, the solar cell module according to the present invention may incorporate solar cells using polymer film substrates. This allows known three-layered constructions to be used as water vapor proofing films in the module, providing an advantage whereby the construction of the module as a whole can be simplified.

Figure 8:
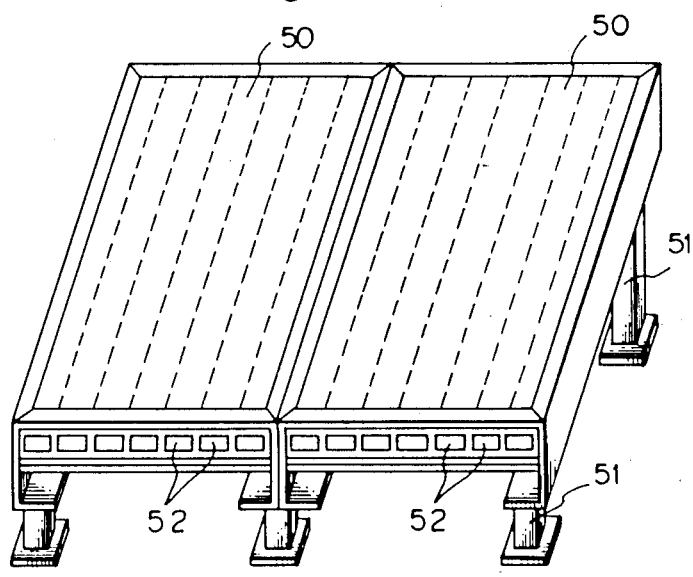
FIG. 8 is a perspective view of an array installation.

FIG. 8 shows an example of a solar battery module which is installed under sunlight, according to the present invention. In FIG. 8, reference numeral 50 denotes a module and 51 a mounting. The parallel pillar-like hollow sections 52 of the hollow multilayer structure are inclined to the ground, at an angle of, e.g., about 35 degrees.

What is claimed is:

1. A solar cell module, comprising:
   window means defined by transparent hollow multilayer structure, comprising a plurality of transparent sheets spaced apart by a plurality of reinforcing strips inserted between and connected to said transparent sheets;
   solar power generation means having a light receiving side and a back side, said solar power generation means being adhered to and supported by said window means, said window means being disposed on said light receiving side of said solar power generation means; and
   sealing means for sealing at least one surface of said solar power generation means, said solar power generation means being sealed as a whole by a combination of said window means and said sealing means.

2. A module according to claim 1, wherein said reinforcing strips are arranged in parallel with each other to define parallel and linear pillar-like hollow chimney sections between the transparent sheets, each of said hollow sections being open to the atmosphere at ends thereof.

3. A module according to claim 1, wherein said solar power generation means comprises an insulating substrate of a flexible polymer film and a plurality of amorphous semiconductor solar cell units formed on the insulating substrate, which units are electrically connected.

4. A module according to claim 1, wherein said window means is made of polycarbonate resin.

5. A module according to claim 1, wherein said sealing means includes a transparent water vapor proof film on the back side of said solar power generation means.

6. A module according to claim 1, wherein said window means further comprises a transparent abrasion resistant film on the surface thereof facing the atmosphere.

7. A solar cell module, comprising; solar power generation means supported by a window member, said solar power generation means having collector electrodes each comprising a bus bar and fingers extending from the bus bar in the form of a comb on the light receiving side of the solar power generating means, said window member comprising a transparent hollow multilayer structure including a plurality of transparent sheets spaced by reinforcing members inserted between and connected to said transparent sheets, said window member being disposed on the light receiving side of the solar power generation means in such a manner that said reinforcing members of the window member overlap the bus bars.

8. A module according to claim 7, wherein said window member is disposed on said solar power generation means in such a manner that all said reinforcing members of the window member overlap said bus bars.

9. A module according to claim 8, wherein said solar power generation means includes an insulating substrate and a plurality of solar cell units formed on the insulating substrate, which units are electrically connected.

10. A module according to claim 9, wherein said bus bars are present at portions between said respective cell units.

11. A module according to claim 10, wherein the reinforcing members are arranged in parallel with each other to define parallel pillar-like hollow sections between the transparent sheets, all of said pillar-like hollow sections being open to the atmosphere.

12. A module according to claim 9, wherein said insulating substrate is a flexible polymer film and said solar cell units comprise an amorphous semiconductor.

13. A module according to claim 7, wherein the reinforcing members are arranged in parallel with each other to define parallel pillar-like hollow sections between the transparent sheets, all of said pillar-like hollow sections being open to the atmosphere.

14. A module according to claim 7, wherein said transparent hollow multilayer structure is made of a synthetic resin.

15. A module according to claim 14, wherein said transparent hollow multilayer structure is made of polycarbonate resin.

16. A module according to claim 14, wherein said module further comprises a transparent water vapor proof film on the module surface facing the solar power generation means.

17. A module according to claim 14, wherein said window member further comprises a transparent abrasion resistant film on the surface thereof facing the atmosphere.

18. A module according to claim 7, wherein the back of the solar power generation means, opposite to said window member, is sealed with a sealing material.

19. A solar cell module, comprising;
  (a) an array of solar power generating elements disposed on a common substrate;
  (b) light transparent window means adhered to the light incident surface of said array and at least dimensionally coextensive with said array; and
  (c) means for supporting said array and said window means;
  wherein said window means comprises a plurality of transparent sheets of synthetic resin spaced apart by reinforcing strips, said strips and said sheets together defining a plurality of substantially parallel chimneys open to the atmosphere at the ends thereof.

* * * * *